US006937016B2

(12) United States Patent
Wang

(10) Patent No.: US 6,937,016 B2
(45) Date of Patent: Aug. 30, 2005

(54) RECEPTION DEVICE FOR A MAGNETIC RESONANCE TOMOGRAPHY INSTALLATION, HAVING A PHASE SHIFT-COMPENSATING AMPLIFIER

(75) Inventor: Jianmin Wang, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 33 days.

(21) Appl. No.: 10/153,580

(22) Filed: May 22, 2002

(65) Prior Publication Data

US 2002/0196021 A1 Dec. 26, 2002

(30) Foreign Application Priority Data

May 22, 2001 (DE) .......................................... 101 25 233

(51) Int. Cl.⁷ ................................................. G01V 3/00
(52) U.S. Cl. ...................................................... 324/318
(58) Field of Search ................................ 324/307–309, 324/318, 322; 600/410

(56) References Cited

U.S. PATENT DOCUMENTS

| | | | | |
|---|---|---|---|---|
| 4,095,168 A | * | 6/1978 | Hlavka | 324/322 |
| 4,467,282 A | * | 8/1984 | Siebold | 324/309 |
| 4,857,849 A | * | 8/1989 | Sakamoto | 324/318 |
| 5,170,123 A | * | 12/1992 | Holland et al. | 324/322 |
| 5,179,332 A | * | 1/1993 | Kang | 324/313 |
| 5,208,537 A | * | 5/1993 | Rietsch et al. | 324/322 |
| 5,252,922 A | * | 10/1993 | Larson, III | 324/309 |
| 5,430,378 A | * | 7/1995 | Jones | 324/318 |
| 5,489,848 A | * | 2/1996 | Furukawa | 324/318 |
| 5,909,120 A | * | 6/1999 | Mori et al. | 324/322 |
| 6,029,082 A | * | 2/2000 | Srinivasan et al. | 600/422 |
| 6,031,746 A | * | 2/2000 | Steigerwald et al. | 363/71 |
| 6,133,737 A | * | 10/2000 | Greim | 324/318 |
| 6,177,796 B1 | * | 1/2001 | Viti | 324/314 |
| 6,208,135 B1 | * | 3/2001 | Shattil | 324/225 |
| 6,211,671 B1 | * | 4/2001 | Shattil | 324/225 |
| 6,348,791 B2 | * | 2/2002 | Shattil | 324/225 |
| 6,351,124 B1 | * | 2/2002 | Vester et al. | 324/318 |
| 6,396,273 B2 | * | 5/2002 | Misic | 324/318 |

* cited by examiner

*Primary Examiner*—Christopher W. Fulton
*Assistant Examiner*—Dixomara Vargas
(74) *Attorney, Agent, or Firm*—Schiff Hardin LLP

(57) ABSTRACT

A reception device for detecting an electromagnetic radio-frequency wave emitted by the examination subject in a magnetic resonance tomography installation has two reception coils and amplifiers arranged following these coils. The mutually phase-delayed reception signals of the reception coils are tapped by a common signal line. For compensating the phase shift one of the amplifiers is or both amplifiers are directed between the two reception signals. A separate combiner can thereby be advantageously eliminated.

23 Claims, 3 Drawing Sheets

RECEPTION DEVICE FOR A MAGNETIC RESONANCE TOMOGRAPHY INSTALLATION, HAVING A PHASE SHIFT-COMPENSATING AMPLIFIER

BACKGROUND OF THE INVENTION

1. Field of the Invention

The present invention is directed to a reception device for detecting an electromagnetic radio-frequency wave emitted by the examination subject of a nuclear magnetic resonance tomography installation, of the type having a first reception coil, a first amplifier allocated to the first reception coil, a second reception coil whose reception signal is phase-shifted with respect to the reception signal of the first reception coil, particularly by a phase angle of 90°, comprising a second amplifier allocated to the second reception coil, and a common signal line via which the output signals of the two amplifiers are carried off.

2. Description of the Prior Art

For receiving the circularly polarized radio-frequency signal, two orthogonal polarization components are separately received in a magnetic resonance tomography installation. In, for example, a vertical field apparatus, a first polarization component is received parallel to the patient axis and a second polarization component is received perpendicular to the patient axis. For receiving the first polarization component parallel to the patient axis, a loop coil can be used that surrounds the entire patient body or an extremity to be examined. For the reception of the second polarization component, for example, a butterfly coil or saddle coil is used. Both field components of the circularly polarized magnetic field part of the electromagnetic radio-frequency signal can be detected with the separately existing reception coils or reception antennas.

The reception signals of the separately existing reception antennas are amplified in separate pre-amplifiers allocated to the reception antennas and are supplied via a 90° coupler (90° combiner) that takes the phase shift between the two polarization components into consideration to a common signal line. Via the common signal line, the radio-frequency signals combined in this way are supplied to the image evaluation, image reconstruction and image display. The phase shift between the two polarization components typically amounts to 90°. However, dependent on the structure of the magnetic resonance tomography installation, other values below this and above this are possible.

The combiner is composed of a capacitive impedance and of an inductive impedance. The output impedance of the combiner must be matched to the impedance of the common signal line. The lines leading to the combiner as well as the combiner itself must be shielded in an involved way. The known combiner also has the disadvantage that it requires a certain spatial volume for the circuitry, leading to unergonomically bulky arrangements, particularly in the manufacture of non-stationary, i.e. portable coil arrangements, for example in the manufacture of surface coils, because the combiner must be accommodated on the coil arrangement.

SUMMARY OF THE INVENTION

An object of the present invention is to provide a reception device for a magnetic resonance tomography installation wherein the aforementioned disadvantages are avoided.

This object is achieved in a reception device of the type initially described, wherein at least one of the amplifiers compensates the phase shift between the two reception signals.

The invention is based on the perception that the function of the previously employed combiner and be at least partially displaced into the amplifiers or pre-amplifiers, and the combiner can thus be partially or entirely eliminated.

The invention achieves the advantage that the reception device can be constructed more simply, smaller, more economically, less susceptible to malfunction and in a more space-saving way. Moreover, fewer adjustment tasks are needed for the impedance matching, so that the manufacturer is also simplified and the testing costs are reduced. The amplifiers and pre-amplifiers, for example, can have a separate or a common shielding housing wherein the function of the previously employed combiner is relocated.

The output impedances of the two amplifiers are preferably established between the two reception signals for compensating the phase shift.

In particular, a coil at the output side or a capacitor at the output side is used for this purpose.

For processing the reception signals that may be of different strength under certain circumstances, it can be necessary to weight these differently. To this end, for example, the gains of the allocated amplifiers can be set differently by connecting active components. Alternatively or additionally, a weighting is undertaken by a suitable setting of the output impedances, particularly of the coil present at the output side and/or of the capacitor present at the output side. It is not only a phase angle but also an amount, namely that can be set via the output impedance. The case of identical weighting by the output impedances, i.e. the case of equal amounts, is referred to below as the "symmetrical case".

In a preferred embodiment, the output impedances of the two amplifiers are fashioned for generating mutually opposite phase angles, particularly for generating phase angles of −45° or +45°. In this embodiment, the amplifiers contribute in a way that is the same in magnitude but oppositely directed to generating the desired phase shift. This is preferably true in the "symmetrical case". Otherwise, the phase angles can have the same operational sign under certain circumstances, but the difference is adapted to the phase shift between the reception signals that is to be balanced.

It is expedient for avoiding reflections at the output of the two amplifiers for the output impedances of the two amplifiers to be additionally directed to the impedance of the common signal line for adaptation. In complex notation, this means that the output impedances of the two amplifiers comprise complex values that accomplish the generation of a phase shift as well as matching to the signal line.

Preferably, the output impedances of the two amplifiers—in complex notation—are complex conjugates (of each other), particularly in the symmetrical case.

For example, the output impedance of one of the two amplifiers—in complex notation—exhibits the value X+i·X, and the output impedance of the other amplifier exhibits the value X−i·X, whereby X indicates the desired impedance of the common signal line and preferably exhibits a value of 50 Ω. This is preferably true in the symmetrical case.

As already mentioned, it is advantageous in the reception device of the invention that a separate combiner as well as an element for impedance matching of the pre-amplifiers to the common signal line can be eliminated. Preferably, the output lines of the two amplifiers are therefore connected to the common signal line either directly, or without interposition of phase-delaying elements, particularly without longer signal paths or lines that produce noticeable phase shifts.

Due to the susceptibility to malfunction and shielding, it is expedient for the two amplifiers to be fashioned as an assembly unit and, in particular, to be arranged in a common housing or shielded housing.

DESCRIPTION OF THE PREFERRED EMBODIMENTS

For easier comprehension, a phase shift of exactly 90° between the received polarization components forms the basis of the discussion below. The considerations can be transferred to cases having a different phase shift.

Figure 1:
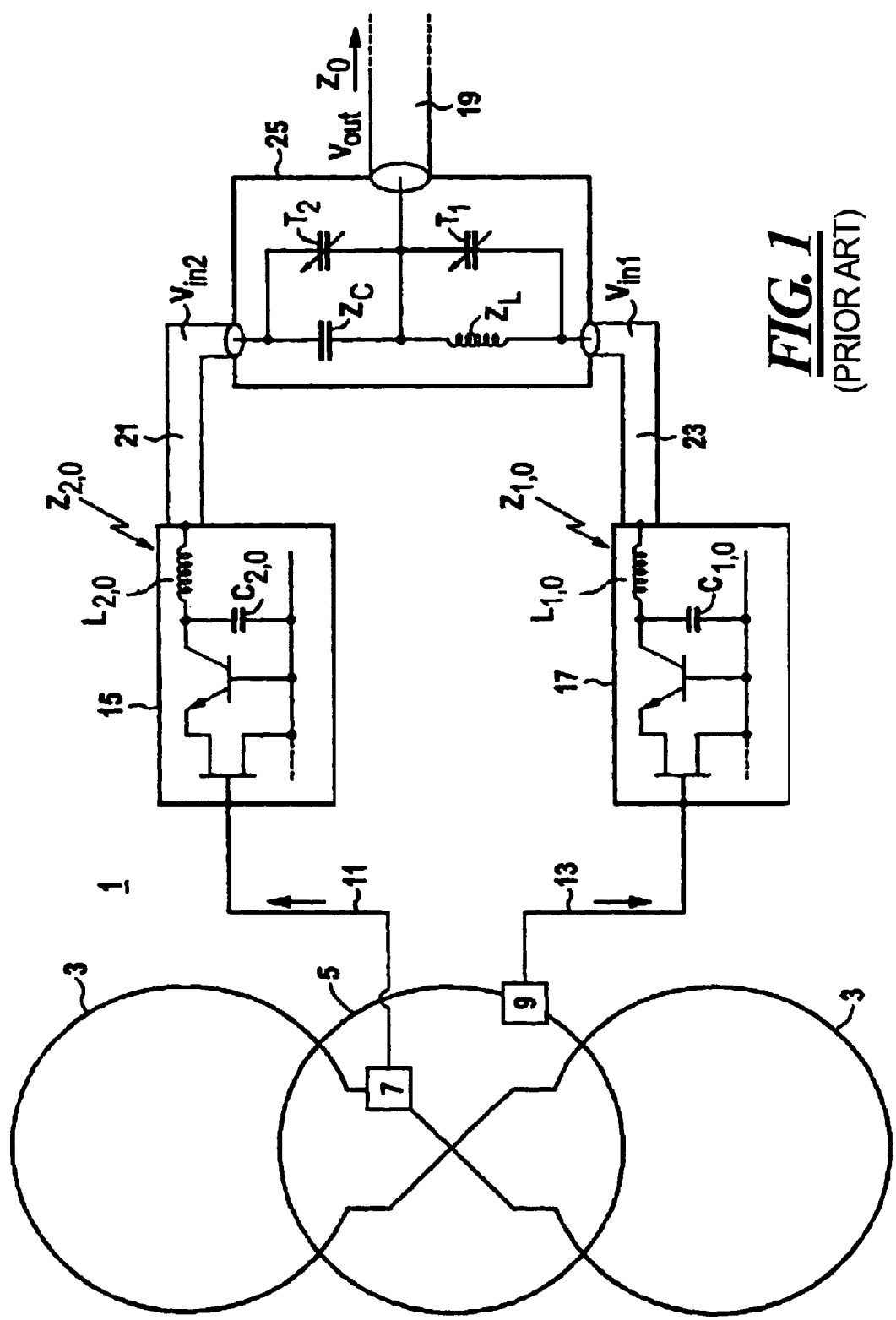
FIG. 1 illustrates a reception device of the prior art.

FIG. 1 shows a reception device 1 of a magnetic resonance tomography installation whose other component parts are not explicitly shown. The reception device 1 has a first reception coil 3 that is fashioned as a butterfly element. A second reception coil 5 fashioned as a loop element. Matching networks 7 and 9 are respectively integrated into the coil elements 3, 5, these serving the purpose of noise matching. The matching network 7 of the first reception coil 3 is connected via a line 11 to a first pre-amplifier or to a first amplifier 15. In the same way, the matching network 9 of the second reception coil 5 is in communication via a line 13 with a second pre-amplifier or a second amplifier 17.

The output signals of the two amplifiers 15, 17—respectively shielded with separate housings—are supplied to a 90° combiner 25 via shielded coaxial lines 21 and 23 in the known reception device 1 of FIG. 1. The 90° combiner 25 has to be separately shielded. At its output, the 90° combiner 25 is in communication with a common signal line 19 implemented as a shielded coaxial cable and via which the signals are supplied in common to the image evaluation, circuitry and other components.

The circuit structure of the two amplifiers 15, 17 is only schematically shown, without detail. The circuit includes a field effect transistor and a transistor at the output side. For matching the output impedance $Z_{2,0}$ of the first amplifier 15 to an ohmic line impedance of $R_0=50\ \Omega$ of the line 21, the amplifier 15 contains a capacitor $C_{2,0}$ connected in parallel, and an inductance $L_{2,0}$ connected in series, at its output. For matching the output impedance $Z_{1,0}$ of the second amplifier 17 to an ohmic line impedance $R_0=50\ \Omega$ of the line 23, the amplifier 17 contains a capacitor $C_{1,0}$ connected in parallel, and an inductance $L_{1,0}$ connected in series, at its output.

Conventionally, the output impedances $Z_{2,0}$ and $Z_{1,0}$ of the amplifiers 15, 17 are respectively matched to a value of $R_0=50\ \Omega$ with the capacitors $C_{1,0}$, $C_{2,0}$ and coils $L_{1,0}$, $L_{2,0}$. The output resistance R of the transistor must be taken into consideration. The following matching condition derives:

$$Z_{2,0} \equiv \frac{1}{\frac{1}{R}+i\omega\cdot C_{2,0}} + i\omega\cdot L_{2,0} = R_0 \qquad \text{Equation 1}$$

Figure 2:
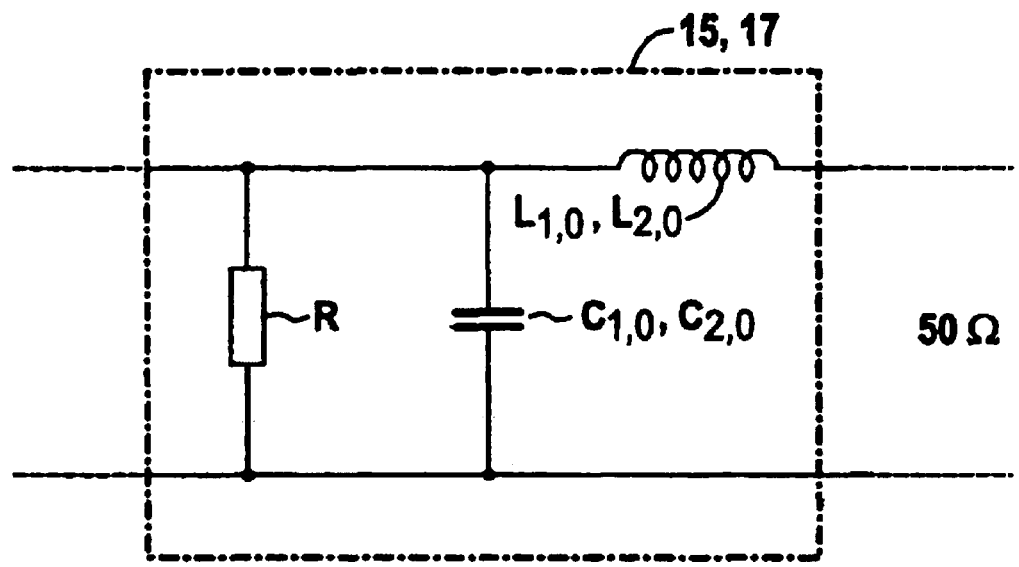
FIG. 2 is an equivalent circuit diagram for the output of an amplifier.

The above matching condition is reproduced for the first amplifier 15 and analogously applies to the second amplifier 17 with the values $C_{1,0}$, $L_{1,0}$. the radian frequency $\omega=2\cdot\pi\cdot f$ of the magnetic tomograph (for example, 63.6 MHz for a 1.5 Tesla system). The creation of the matching condition is illustrated in detail in the equivalent circuit diagram of FIG. 2. In FIG. 2, the output of the transistor is symbolized by an output resistance R ($\approx 2\ k\Omega$) that is followed by the capacitors $C_{1,0}$ or $C_{2,0}$ and coils $L_{1,0}$ or $L_{2,0}$ provided for the matching, and with which a matching to $50\ \Omega$ is undertaken.

The following dimensioning rules for the capacitor $C2,0$ derive from the matching condition according to Equation 1:

$$C_{2,0} = \frac{\sqrt{R\cdot R_0 - R_0^2}}{\omega\cdot R\cdot R_0} = 7.8\ \text{pF} \qquad \text{Equation 2}$$

and, for the coil $L_{2,0}$:

$$L_{2,0} = R_0\cdot R\cdot C_{2,0} = 781.4\ \text{nH} \qquad \text{Equation 3}$$

The combiner 25 shown in FIG. 1 is reproduced with a schematic circuit diagram. The combiner 25 is composed of a capacitive impedance ZC and an inductive impedance $Z_L$. The output signal $V_{out}$ is composed—according to the following equation, of the respective input signals $V_{in1}$ or $V_{in2}$ of the amplifiers 15, 17:

$$V_{out} = \frac{Z_L + Z_{2,0}}{Z_{1,0}+Z_C+Z_L+Z_{2,0}} V_{in2} + \frac{Z_L + Z_{1,0}}{Z_{1,0}+Z_C+Z_L+Z_{2,0}} V_{in1} \qquad \text{Equation 4}$$

In order to realize a 90° combiner, the impedances $ZC=-i\ 50\ \Omega$ and $ZL=+i\ 50\ \Omega$ must apply given a source impedances $Z1,0=Z2,0=50\ \Omega$ at the input side. The output signal is then established by:

$$V_{out} = \frac{1}{\sqrt{2}}\left(e^{i\frac{\pi}{4}}\cdot V_{in2} + e^{-i\frac{\pi}{4}}\cdot V_{in1}\right) \qquad \text{Equation 5}$$

In order to achieve an exact phase difference, the amplifier outputs are usually set to $50\ \Omega$. Trimming capacitors $T_1$, $T_2$ with which the combiner 25 can also be exactly set are provided for the two impedances $Z_C$ and $Z_L$.

Figure 3:
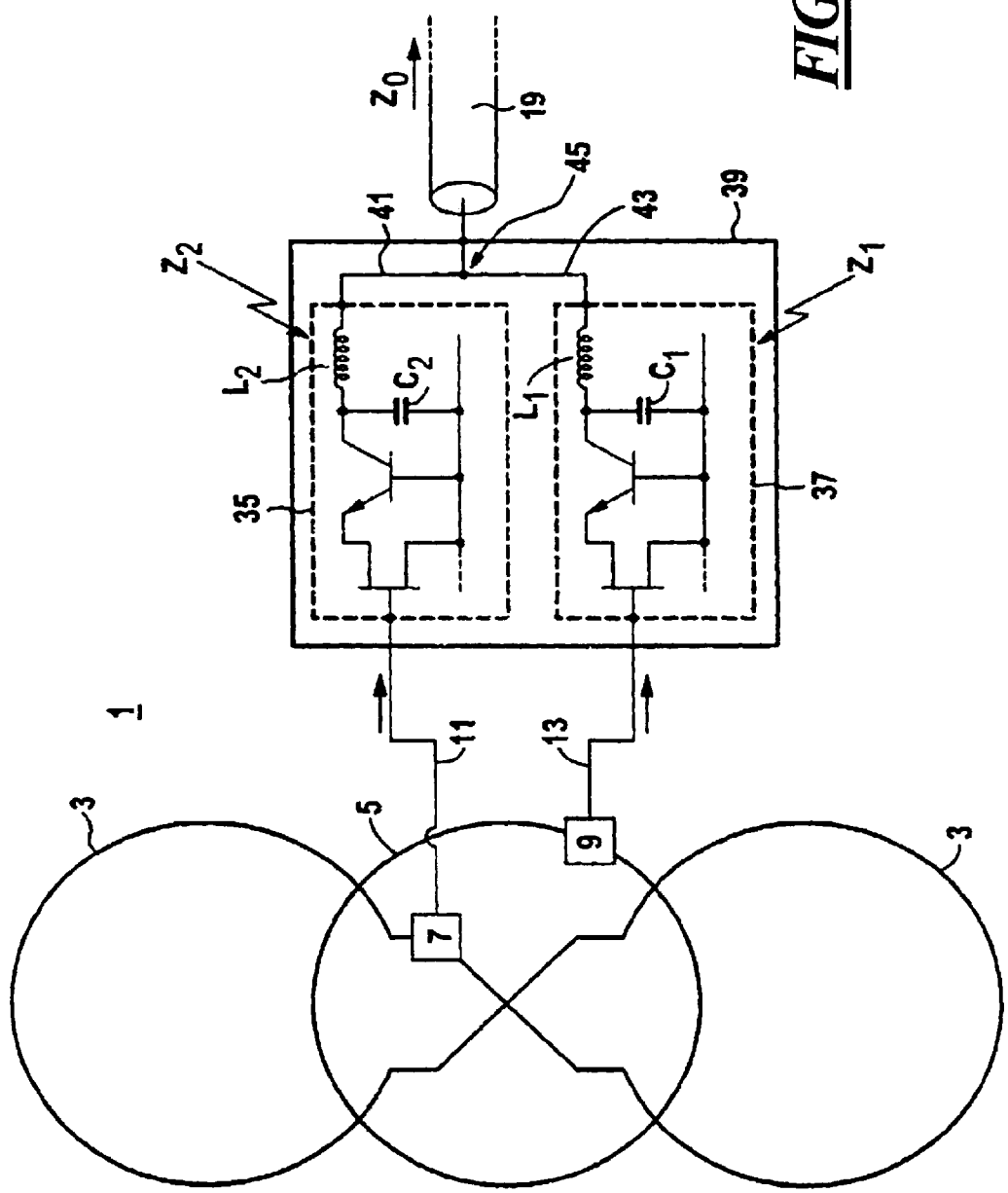
FIG. 3 illustrates a reception device of the invention.

The reception device 1 of the invention in FIG. 3, has a first pre-amplifier or first amplifier 35 and a second pre-amplifier or second amplifier 37 that are dimensioned differently at the output side than are the amplifiers 15, 17 of FIG. 1.

Since the two amplifiers 35, 37 of FIG. 3 are tuned relative to one another for achieving the desired phase shift, the combination of the two amplifiers 35, 37 can be interpreted as a double-amplifier unit 39 and/or—on the basis of corresponding structural measures, can be constructed as an assembly unit, for example on a shared motherboard. The double-amplifier unit 39 preferably has a common shielding housing, having two inputs and one output in the example.

Figure 4:
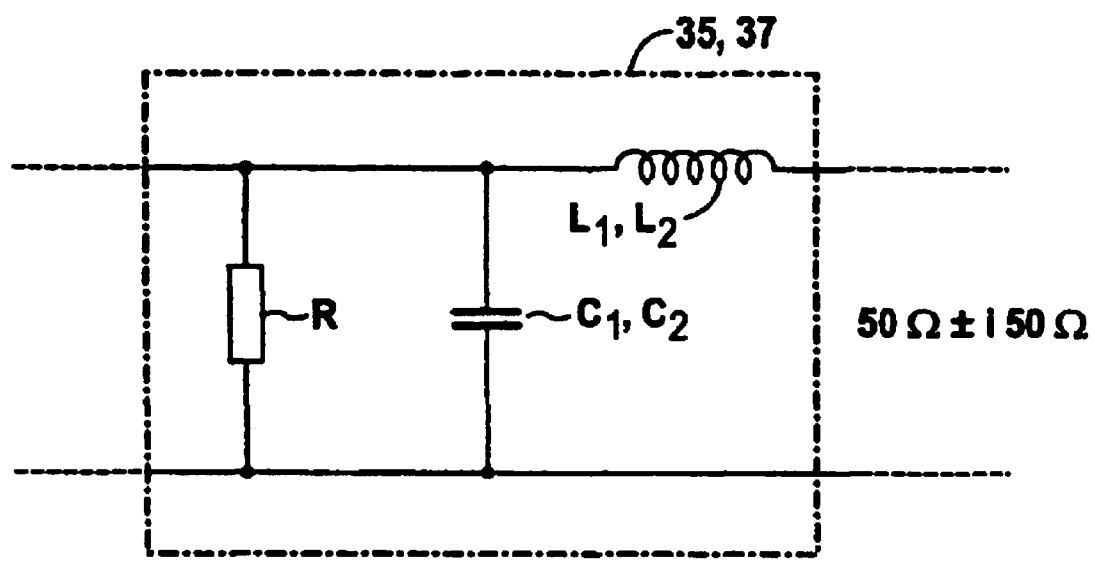
FIG. 4 is an equivalent circuit diagram for the output of an amplifier.

In contrast to the known arrangement shown in FIG. 1, the combiner 25 and, in particular, the impedances $Z_C$ and $Z_L$ are superfluous as separate components in the reception device 1 of the invention—which is explained in greater detail in FIG. 3—because their function is at least partially integrated into the amplifiers 35, 37. This by virtue of the output impedances $Z_1$ and $Z_2$ of the two amplifiers 35 and 37—in contrast to the amplifiers 15, 17 of FIG. 1—being set to a value of $50\ \Omega-i\ 50\ \Omega$ and $50\ \Omega+i\ 50\ \Omega$, respectively. The equivalent circuit diagram of FIG. 4 be used again for explanation. The matching condition for the symmetrical case accordingly, for example for the first amplifier 35, is as follows:

$$Z_2 \equiv \frac{1}{\frac{1}{R}+i\omega\cdot C_2} + i\omega\cdot L_2 = R_0 + i\cdot 50\Omega \qquad \text{Equation 6}$$

The following dimensioning rules derive therefrom for the capacitors $C_1$, $C_2$ and coils $L_1$, $L_2$ present at the output side in the amplifiers 15, 17 (only shown here for the first amplifier 15):

$$C_2 = C_{2,0} \quad \text{Equation 7}$$

$$L_2 = L_{2,0} = \frac{50\Omega}{\omega} = 906.5 \ nH \quad \text{Equation 8}$$

Thus, due to an increase to 906.5 nH, or a reduction (to 656.3 nH) in the values of the inductances $L_2$, $L_1$ compared to the corresponding values $L_{2,0}$, $L_{1,0}$ of the case shown in FIG. 1, a phase shift can already realized in the amplifiers 35 or 37. As a result, it is possible to achieve a desired effect of a combiner by simply connecting the outputs of the amplifiers 35, 37 via output lines 41, 43 and via a simple T-element or a T-shaped line 45, namely connection thereof to the common signal line 19. At the same time, the amplifiers 35, 37 are matched to the line impedance $Z_0$ of the common signal line 19. The output lines 41, 43 can be realized on the circuit board of the amplifiers 35, 37 and are expediently only a few mm long (shown longer in FIG. 3 for purpose of illustration).

The amplifiers 35, 37 with "quasi-integrated combiner" have the advantage that a separate combiner is not required and, thus, costs for material and testing can be eliminated. A coil module with one or both coils 3, 5 and one or both amplifiers 35 and 37 can be constructed smaller as a result. In particular, an array coil can thus be constructed in an especially simple way.

Although modifications and changes may be suggested by those skilled in the art, it is the intention of the inventor to embody within the patent warranted hereon all changes and modifications as reasonably and properly come within the scope of the inventor's contribution to the art.

I claim:

1. A reception device for a magnetic resonance tomography installation, comprising:
    a first reception coil for detecting an electromagnetic radio-frequency wave emitted by an examination subject in whom nuclear spins have been excited and for producing a reception signal therefrom;
    a first amplifier supplied with said reception signal from said first reception coil, which generates an output signal dependent thereon;
    a second reception coil for detecting said electromagnetic radio-frequency wave and for producing a reception signal therefrom that is phase-shifted with respect to the reception signal of said first reception coil;
    a second amplifier supplied with said reception signal from said second reception coil, which generates an output signal dependent thereon;
    a common signal line connected to said first amplifier and to said second amplifier for tapping the respective output signals of said first amplifier and said second amplifier and in which the respective output signals are superimposed to produce a raw signal in a form for magnetic resonance image reconstruction; and
    at least one of said first amplifier and said second amplifier compensating said phase shift between the respective reception signals.

2. A reception device as claimed in claim 1 wherein said first amplifier has a first output impedance and wherein said second amplifier has a second output impedance, said first output impedance and said second output impedance being selected for compensating said phase shift.

3. A reception device as claimed in claim 2 wherein said first output impedance and said second output impedance are selected for generating oppositely directed phase angles of the respective output signals of the first amplifier and the second amplifier.

4. A reception device as claimed in claim 3 wherein said first output impedance and said second output impedance are selected for generating respective phase angles of −45° and +45°.

5. A reception device as claimed in claim 2 wherein said first output impedance and said second output impedance are additionally selected for matching the respective first amplifier and second amplifier to an impedance of said common signal line.

6. A reception device as claimed in claim 2 wherein said first output impedance and said second output impedance are complex conjugates.

7. A reception device as claimed in claim 2 wherein one of said first and second output impedance has a value X+i·X, and wherein the other of said first and second output impedances has a value X−i·X, wherein X represents an impedance of said common signal line.

8. A reception device as claimed in claim 7 wherein said common signal line has an impedance of 50 Ω.

9. A reception device as claimed in claim 1 further comprising a first output line directly connecting said first amplifier to said common signal line, and a second output line directly connecting said second amplifier to said common signal line.

10. A reception device as claimed in claim 1 further comprising a first output line connecting said first amplifier to said common signal line with no phase-delaying elements, and a second output line connecting said second amplifier to said common signal line with no phase-delaying elements.

11. A reception device as claimed in claim 1 wherein said first amplifier and said second amplifier comprise a module unit.

12. A reception device as claimed in claim 11 wherein said module unit has a housing containing both of said first and second amplifiers.

13. A reception device as claimed in claim 12 wherein said housing is a shielded housing.

14. A reception device as claimed in claim 1 wherein the reception signal produced by said second reception coil is phase-shifted by 90° with respect to the reception signal produced by said first reception coil.

15. A method for operating a reception device in a magnetic resonance tomography installation, comprising the steps of:
    detecting an electromagnetic radio-frequency wave, emitted by an examination subject in whom nuclear spins have been excited, with a first reception coil and producing a reception signal therefrom;
    amplifying said reception signal from said first reception coil in a first amplifier and generating an amplifier output signal dependent thereon;
    detecting said electromagnetic radio-frequency wave with a second reception coil, and producing a reception signal therefrom that is phase-shifted with respect to the reception signal of the first reception coil;
    amplifying the reception signal from the second reception coil in a second amplifier and generating an output signal dependent thereon;
    superimposing the respective output signals in a common signal line connected to said first amplifier and to said second amplifier, and producing a raw signal in a form for magnetic resonance image reconstruction; and
    in at least one of said first amplifier and said second amplifier, compensating said phase shift between the respective reception signals.

16. A method as claimed in claim 15 wherein said first amplifier has a first output impedance and wherein said second amplifier has a second output impedance, and selecting said first output impedance and said second output impedance for compensating said phase shift.

17. A method as claimed in claim 16 comprising selecting said first output impedance and said second output impedance for generating oppositely directed phase angles of the respective output signals of the first amplifier and the second amplifier.

18. A method as claimed in claim 17 comprising selecting said first output impedance and said second output impedance and said second output impedance for generating respective phase angles of −45° and +45°.

19. A method as claimed in claim 16 comprising additionally selecting said first output impedance and said second output impedance for matching the respective first amplifier and second amplifier to an impedance of said common signal line.

20. A method as claimed in claim 16 comprising employing complex conjugates as said first output impedance and said second output impedance.

21. A method as claimed in claim 16 comprising employing a value X+i·X as one of said first and second output impedance, and employing a value X−i·X as the other of said first and second output impedances, wherein X represents an impedance of said common signal line.

22. A method as claimed in claim 15 comprising directly connecting said first amplifier to said common signal line with no phase-delaying elements, and directly connecting said second amplifier to said common signal line with no phase-delaying elements.

23. A method as claimed in claim 15 comprising employing respective reception coils as said first and second reception coils for causing the reception signal produced by said second reception coil to be phase-shifted by 90° with respect to the reception signal produced by said first reception coil.

* * * * *